(12) United States Patent
Ho et al.

(10) Patent No.: US 8,587,983 B2
(45) Date of Patent: Nov. 19, 2013

(54) RESISTANCE RANDOM ACCESS MEMORY STRUCTURE FOR ENHANCED RETENTION

(75) Inventors: ChiaHua Ho, Kaoshing (TW); Erh-Kun Lai, Elmsford, NY (US); Kuang Yeu Hsieh, Hsinchu (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 13/281,266

(22) Filed: Oct. 25, 2011

(65) Prior Publication Data

US 2012/0037876 A1 Feb. 16, 2012

Related U.S. Application Data

(63) Continuation of application No. 11/560,723, filed on Nov. 16, 2006, now Pat. No. 8,067,762.

(51) Int. Cl.
*H01L 45/00* (2006.01)

(52) U.S. Cl.
USPC ............ 365/100; 365/148; 438/95; 438/104; 257/43; 257/209

(58) Field of Classification Search
USPC ......... 257/2, 4, 303, 306, 516, 532, 536, 537, 257/E27.006, E47.001, 68, 71, 296, 298, 257/300, E27.016
See application file for complete search history.

(56) References Cited

U.S. PATENT DOCUMENTS

| | | |
|---|---|---|
| 3,271,591 A | 9/1966 | Ovshinsky |
| 3,530,441 A | 9/1970 | Ovshinsky |
| 4,599,705 A | 7/1986 | Holmberg et al. |
| 4,719,594 A | 1/1988 | Young et al. |
| 4,876,220 A | 10/1989 | Mohsen et al. |

(Continued)

FOREIGN PATENT DOCUMENTS

| | | |
|---|---|---|
| TW | 452607 B | 9/2001 |
| WO | 9712393 | 4/1997 |

(Continued)

OTHER PUBLICATIONS

Adler, David, "Amorphous-Semiconductor Devices," Sci. Amer., vol. 236, pp. 36-48, May 1977.

(Continued)

*Primary Examiner* — Olik Chaudhuri
*Assistant Examiner* — Quovaunda V Jefferson
(74) *Attorney, Agent, or Firm* — Haynes Beffel & Wolfeld LLP

(57) ABSTRACT

A bistable resistance random access memory is described for enhancing the data retention in a resistance random access memory member. A dielectric member, e.g. the bottom dielectric member, underlies the resistance random access memory member which improves the SET/RESET window in the retention of information. The deposition of the bottom dielectric member is carried out by a plasma-enhanced chemical vapor deposition or by high-density-plasma chemical vapor deposition. One suitable material for constructing the bottom dielectric member is a silicon oxide. The bistable resistance random access memory includes a bottom dielectric member disposed between a resistance random access member and a bottom electrode or bottom contact plug. Additional layers including a bit line, a top contact plug, and a top electrode disposed over the top surface of the resistance random access memory member. Sides of the top electrode and the resistance random access memory member are substantially aligned with each other.

20 Claims, 11 Drawing Sheets

(56) References Cited

U.S. PATENT DOCUMENTS

| | | |
|---|---|---|
| 5,166,096 A | 11/1992 | Cote et al. |
| 5,166,758 A | 11/1992 | Ovshinsky et al. |
| 5,177,567 A | 1/1993 | Klersy et al. |
| 5,534,712 A | 7/1996 | Ovshinsky et al. |
| 5,687,112 A | 11/1997 | Ovshinsky |
| 5,688,713 A | 11/1997 | Linliu et al. |
| 5,716,883 A | 2/1998 | Tseng |
| 5,789,277 A | 8/1998 | Zahorik et al. |
| 5,789,758 A | 8/1998 | Reinberg |
| 5,807,786 A | 9/1998 | Chang |
| 5,814,527 A | 9/1998 | Wolstenholme et al. |
| 5,825,046 A | 10/1998 | Czubatyj et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,920,788 A | 7/1999 | Reinberg |
| 5,952,671 A | 9/1999 | Reinberg et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,077,729 A | 6/2000 | Harshfield |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,314,014 B1 | 11/2001 | Lowrey et al. |
| 6,320,786 B1 | 11/2001 | Chang et al. |
| 6,339,544 B1 | 1/2002 | Chiang et al. |
| 6,351,406 B1 | 2/2002 | Johnson et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,462,353 B1 | 10/2002 | Gilgen |
| 6,483,736 B2 | 11/2002 | Johnson et al. |
| 6,487,114 B2 | 11/2002 | Jong et al. |
| 6,489,645 B1 | 12/2002 | Uchiyama |
| 6,501,111 B1 | 12/2002 | Lowrey |
| 6,507,061 B1 | 1/2003 | Hudgens et al. |
| 6,511,867 B2 | 1/2003 | Lowrey et al. |
| 6,512,241 B1 | 1/2003 | Lai |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng |
| 6,597,009 B2 | 7/2003 | Wicker |
| 6,605,477 B2 | 8/2003 | Uchiyama |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,733,956 B2 | 5/2004 | Maimon et al. |
| 6,744,088 B1 | 6/2004 | Dennison |
| 6,791,102 B2 | 9/2004 | Johnson et al. |
| 6,797,979 B2 | 9/2004 | Chiang et al. |
| 6,800,563 B2 | 10/2004 | Xu |
| 6,815,704 B1 | 11/2004 | Chen |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,888,750 B2 | 5/2005 | Walker et al. |
| 6,894,305 B2 | 5/2005 | Yi et al. |
| 6,897,467 B2 | 5/2005 | Doan et al. |
| 6,909,107 B2 | 6/2005 | Rodgers et al. |
| 6,927,410 B2 | 8/2005 | Chen |
| 6,933,218 B1 | 8/2005 | Lee et al. |
| 6,933,516 B2 | 8/2005 | Xu |
| 6,936,840 B2 | 8/2005 | Sun et al. |
| 6,937,507 B2 | 8/2005 | Chen |
| 6,972,428 B2 | 12/2005 | Maimon |
| 6,992,932 B2 | 1/2006 | Cohen |
| 7,029,924 B2 | 4/2006 | Hsu et al. |
| 7,164,147 B2 | 1/2007 | Lee et al. |
| 7,393,798 B2 | 7/2008 | Campbell |
| 8,067,762 B2 | 11/2011 | Ho et al. |
| 2001/0049170 A1 | 12/2001 | Chen et al. |
| 2003/0082908 A1 | 5/2003 | Lowrey |
| 2003/0224598 A1 | 12/2003 | Lee et al. |
| 2004/0113137 A1* | 6/2004 | Lowrey .................. 257/5 |
| 2004/0114413 A1 | 6/2004 | Parkinson et al. |
| 2004/0115372 A1 | 6/2004 | Lowrey |
| 2004/0137709 A1 | 7/2004 | Zhang et al. |
| 2004/0248339 A1 | 12/2004 | Lung |
| 2005/0032319 A1 | 2/2005 | Dodge |
| 2005/0037546 A1 | 2/2005 | Yeh et al. |
| 2005/0093022 A1 | 5/2005 | Lung |
| 2005/0110983 A1 | 5/2005 | Jeong et al. |
| 2005/0128681 A1 | 6/2005 | Iwashita et al. |
| 2005/0215009 A1 | 9/2005 | Cho |
| 2006/0003263 A1 | 1/2006 | Chang |
| 2006/0003470 A1 | 1/2006 | Chang |
| 2006/0038221 A1 | 2/2006 | Lee et al. |
| 2006/0054950 A1 | 3/2006 | Baek et al. |
| 2006/0073642 A1 | 4/2006 | Yeh et al. |
| 2006/0077741 A1 | 4/2006 | Wang et al. |
| 2006/0194403 A1 | 8/2006 | Li et al. |
| 2006/0226411 A1 | 10/2006 | Lee |
| 2006/0286762 A1 | 12/2006 | Tseng et al. |
| 2007/0045605 A1 | 3/2007 | Hsueh |
| 2007/0072125 A1 | 3/2007 | Sousa et al. |
| 2009/0148980 A1 | 6/2009 | Yu |
| 2009/0298223 A1 | 12/2009 | Cheek et al. |

FOREIGN PATENT DOCUMENTS

| | | |
|---|---|---|
| WO | 00/45108 | 8/2000 |
| WO | 00/79539 | 12/2000 |
| WO | 01/45108 | 6/2001 |

OTHER PUBLICATIONS

Adler, D. et al., "Threshold Switching in Chalcogenide-Glass Thin Films," J. Appl/Phys 51(6), Jun. 1980, pp. 3289-3309.

Ahn, S.J. et al., "A Highly Manufacturable High Density Phase Change Memory of 64 Mb and Beyond," IEEE IEDM 2004, pp. 907-910.

Bedeschi, F. et al., "4-MB Mosfet-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

(56) References Cited

OTHER PUBLICATIONS

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gibson, G. A. et al, "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al., "An Edge Contact Type Cell fro Phase Change RAM Featuring Very Low Power Consumption," 2003 Symposium on VLSI Technology Digest of Technical Papers, pp. 175-176.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3.sup.rd E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24.mu.m-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al. "Reliability Investigations for Manufacturable High Density PRAM," IEEE 43.sup.rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

"Magnetic Bit Boost," www.sciencenews.org, Dec. 18 & 25, 2004, p. 389, vol. 166.

Mott, Nevill, "Electrons in Glass," Nobel Lecture, Dec. 8, 1977, Physics, 1977, pp. 403-413.

"New Memories Tap Spin, Gird for Battle," Science News, Apr. 3, 1999, p. 223, vol. 155.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel .mu.Trench Phase-Change Memory Cell for Embedded and Stand-Alone Non-Volatile Memory Applications," 2004 Symposium on VLSI Technology Digest of Technical Papers, pp. 18-19.

Pirovano, Agostino et al., "Reliability Study of Phase-Change Nonvolatile Memories," IEEE Transactions on Device and Materials Reliability, Sep. 2004, pp. 422-427, vol. 4, No. 3.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

"Remembering on the Cheap," www.sciencenews.org, Mar. 19, 2005, p. 189, vol. 167.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, http://klabs.org/richcontent/MAPLDCon99/Papers/P21.sub.--Tyson.sub.--P.PD-F#search='nonvolatile%2Ohigh%20density%20high%20performance%20phase%20chan-ge%20memory', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era—vol. 4, pp. 674-679, 2004.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation OVer Amorphous Substrates," Mat. Res. Soc. Symp. Proc., vol. 106, 1998, pp. 21-26.

* cited by examiner

RESISTANCE RANDOM ACCESS MEMORY STRUCTURE FOR ENHANCED RETENTION

CROSS-REFERENCE TO RELATED APPLICATIONS

This application is a continuation of U.S. patent application Ser. No. 11/560,723, filed 16 Nov. 2006, now U.S. Pat. No. 8,067,762, which application is incorporated by reference as if fully set forth herein.

BACKGROUND OF THE INVENTION

1. Field of the Invention

The present invention relates to high density memory devices based on programmable resistance memory materials, including metal-oxide based materials and other materials, and to methods for manufacturing such devices.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, can also be caused to change phase by application of electrical current at levels suitable for implementation in integrated circuits. The generally amorphous state is characterized by higher resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause the transition of phase change material from the crystalline state to the amorphous state. The magnitude of the reset current needed for reset can be reduced by reducing the size of the phase change material element in the cell and of the contact area between electrodes and the phase change material, so that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

Problems have arisen in manufacturing such devices with very small dimensions, and with variations in process that meet tight specifications needed for large-scale memory devices. As demand for greater memory capacity is sought, a phase change memory that stores multiple bits per memory layer would be highly desirable.

SUMMARY OF THE INVENTION

A bistable resistance random access memory (RRAM) is described for enhancing the retention in a resistance random access memory member. A dielectric member, i.e. the bottom dielectric member, underlies the resistance random access memory member and improves the SET/RESET window in the retention of information over time. The deposition of the bottom dielectric member is carried out by a plasma-enhanced chemical vapor deposition or by high-density-plasma chemical vapor deposition. One suitable material for constructing the bottom dielectric member includes a silicon oxide. An exemplary thickness for the bottom dielectric member ranges from about 1 nm to about 10 nm, or less than 1 nm. Suitable materials for the programmable resistance random access memory member include, but are not limited to, a metal oxide, a colossal magnetoresistance (CMR) material, a two-element oxide, a polymer-based material, and a chalcogenide material. For example, the two-element compounds for implementing the programmable resistance random access memory member include $Ni_xO_y$; $Ti_xO_y$; $Al_xO_y$; $W_xO_y$; $Zn_xO_y$; $Zr_xO_y$; $Cu_xO_y$; etc, where x:y=0.5:0.5, or other compositions with x: 0~1; y: 0~1. Some metal-doped types of materials for implementing a metal-oxide include Al:ZnO and Al:ZrO.

In one embodiment, the bistable resistance random access memory comprises a bottom dielectric member disposed between a resistance random access member and a bottom electrode or bottom contact plug. Additional layers, including a bit line, a top contact plug, and a top electrode, are disposed over the top surface of the resistance random access memory member. Sides of the top electrode and the resistance random access memory member are substantially aligned with each other. In another embodiment, the bistable resistance random access memory includes a bottom dielectric member disposed between a resistance random access member and the contact plug where the resistance random access member embodies the bottom dielectric member. The bottom dielectric member has an upper surface and side walls. The resistance random access memory member substantially covers the upper surface of the bottom dielectric member, and the sidewalls of the bottom dielectric member.

Broadly stated, a memory structure comprises a first electrode and a conductive member; a bottom dielectric member overlying the conductive member, the bottom dielectric member having sides; a resistance memory member overlying the bottom dielectric member, the resistance memory member having sides that are substantially aligned with the sides of the bottom dielectric member; and a top dielectric underlying the first electrode, the top dielectric substantially covering the sides of the resistance random access memory member and the sides of the bottom dielectric member.

Advantageously, the present invention improves the retention duration of a resistance random access memory.

The structures and methods of the present invention are disclosed in the detailed description below. This summary does not purport to define the invention. The invention is defined by the claims. These and other embodiments, features, aspects, and advantages of the technology can be understood with regard to the following description, appended claims and accompanying drawings.

BRIEF DESCRIPTION OF THE DRAWINGS

The invention will be described with respect to specific embodiments thereof, and reference will be made to the drawings, in which.

DETAILED DESCRIPTION

Figure 1:
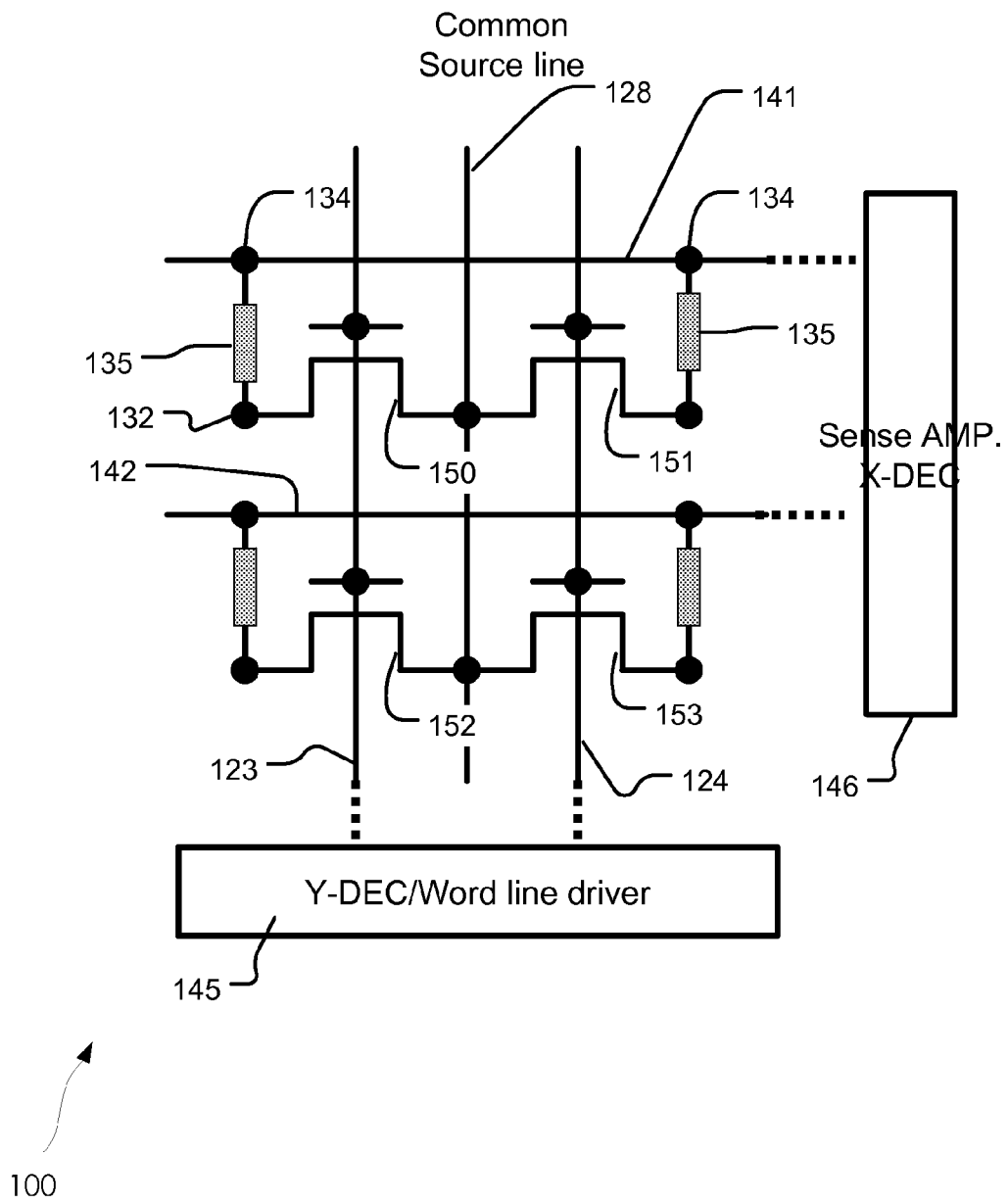
FIG. 1 is a schematic diagram of a bistable resistance random access memory array in accordance with the present invention.

A description of structural embodiments and methods of the present invention is provided with reference to FIGS. 1-10. It is to be understood that there is no intention to limit the invention to the specifically disclosed embodiments but that the invention may be practiced using other features, elements, methods and embodiments. Like elements in various embodiments are commonly referred to with like reference numerals.

FIG. 1 is a schematic illustration of a memory array 100, which can be implemented as described herein. In the schematic illustration of FIG. 1, a common source line 128, a word line 123 and a word line 124 are arranged generally parallel in the Y-direction. Bit lines 141 and 142 are arranged generally parallel in the X-direction. Thus, a Y-decoder and a word line driver in a block 145 are coupled to the word lines 123, 124. An X-decoder and a set of sense amplifiers in block 146 are coupled to the bit lines 141 and 142. The common source line 128 is coupled to the source terminals of access transistors 150, 151, 152 and 153. The gate of access transistor 150 is coupled to the word line 123. The gate of access transistor 151 is coupled to the word line 124. The gate of access transistor 152 is coupled to the word line 123. The gate of access transistor 153 is coupled to the word line 124. The drain of access transistor 150 is coupled to the bottom electrode member 132 for sidewall pin memory cell 135, which has top electrode member 134 and bottom electrode member 132. The top electrode member 134 is coupled to the bit line 141. It can be seen that the common source line 128 is shared by two rows of memory cells, where a row is arranged in the Y-direction in the illustrated schematic. In other embodiments, the access transistors can be replaced by diodes, or other structures for controlling current flow to selected devices in the array for reading and writing data.

Figure 2:
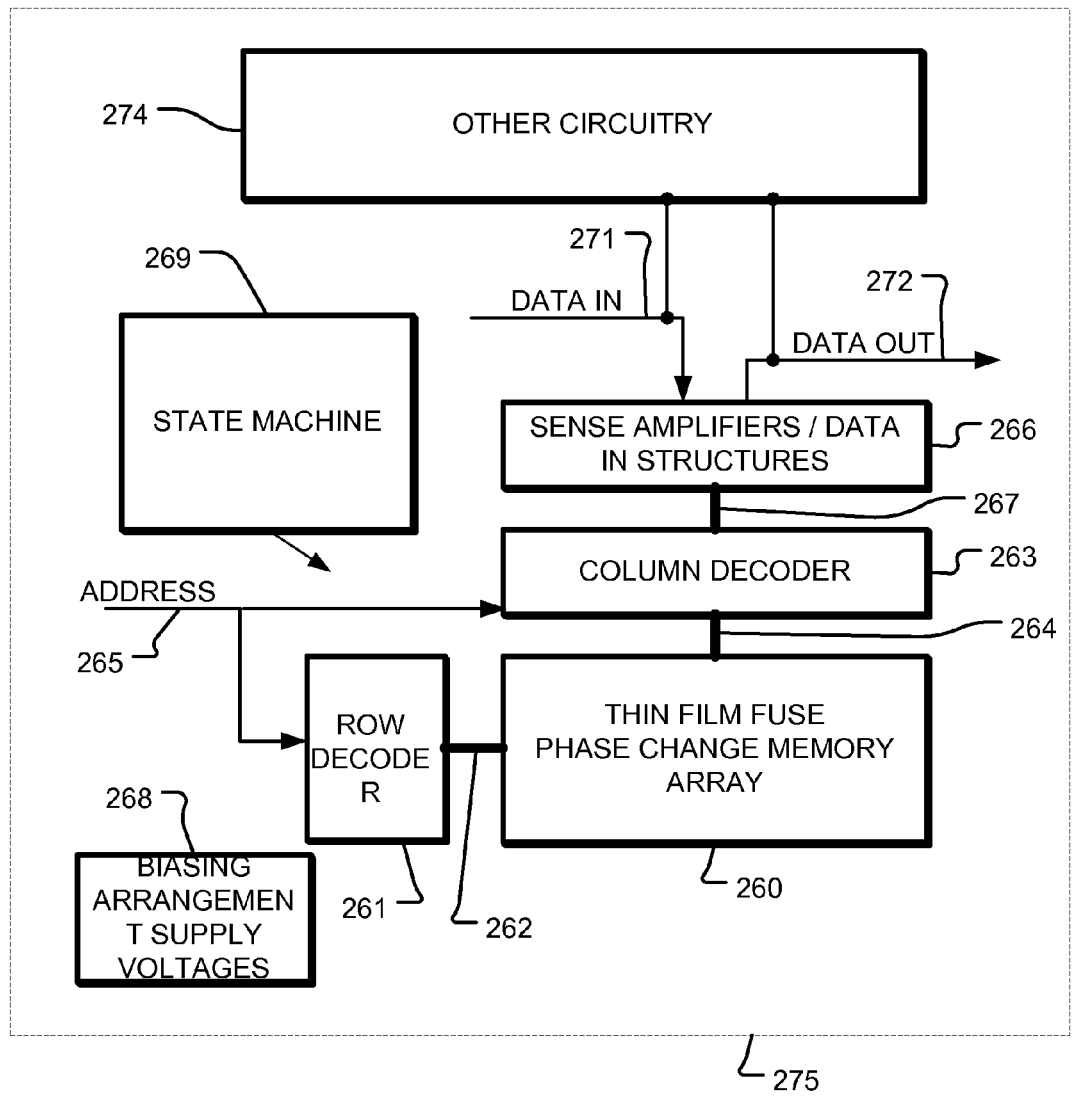
FIG. 2 is a simplified block diagram of an integrated circuit of an RRAM architecture according to an embodiment of the present invention.

FIG. 2 is a simplified block diagram of an integrated circuit 275 of an RRAM architecture according to an embodiment of the present invention. The integrated circuit 275 includes a memory array implemented using sidewall active pin bistable resistance random access memory cells on a semiconductor substrate. A row decoder 261 is coupled to a plurality of word lines 262 arranged along rows in the memory array 260. A pin decoder 263 is coupled to a plurality of bit lines 264 arranged along pins in the memory array 260 for reading and programming data from the sidewall pin memory cells in the memory array 260. Addresses are supplied on a bus 265 to the pin decoder 263 and the row decoder 261. Sense amplifiers and data-in structures in a block 266 are coupled to the pin decoder 263 via a data bus 267. Data is supplied via the data-in line 271 from input/output ports on the integrated circuit 275, or from other data sources internal or external to the integrated circuit 275, to data-in structures in the block 266. In the illustrated embodiment, other circuitry 274 is included on the integrated circuit, such as a general-purpose processor or special purpose application circuitry, or a combination of modules providing system-on-a-chip functionality supported by the thin film bistable resistance random access memory cell array. Data is supplied via the data-out line 272 from the sense amplifiers in block 266 to input/output ports on the integrated circuit 275, or to other data destinations internal or external to the integrated circuit 275.

A controller utilized in this example using bias arrangement state machine 269 controls the application of bias arrangement supply voltages 268, such as read, program, erase, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Figure 3:
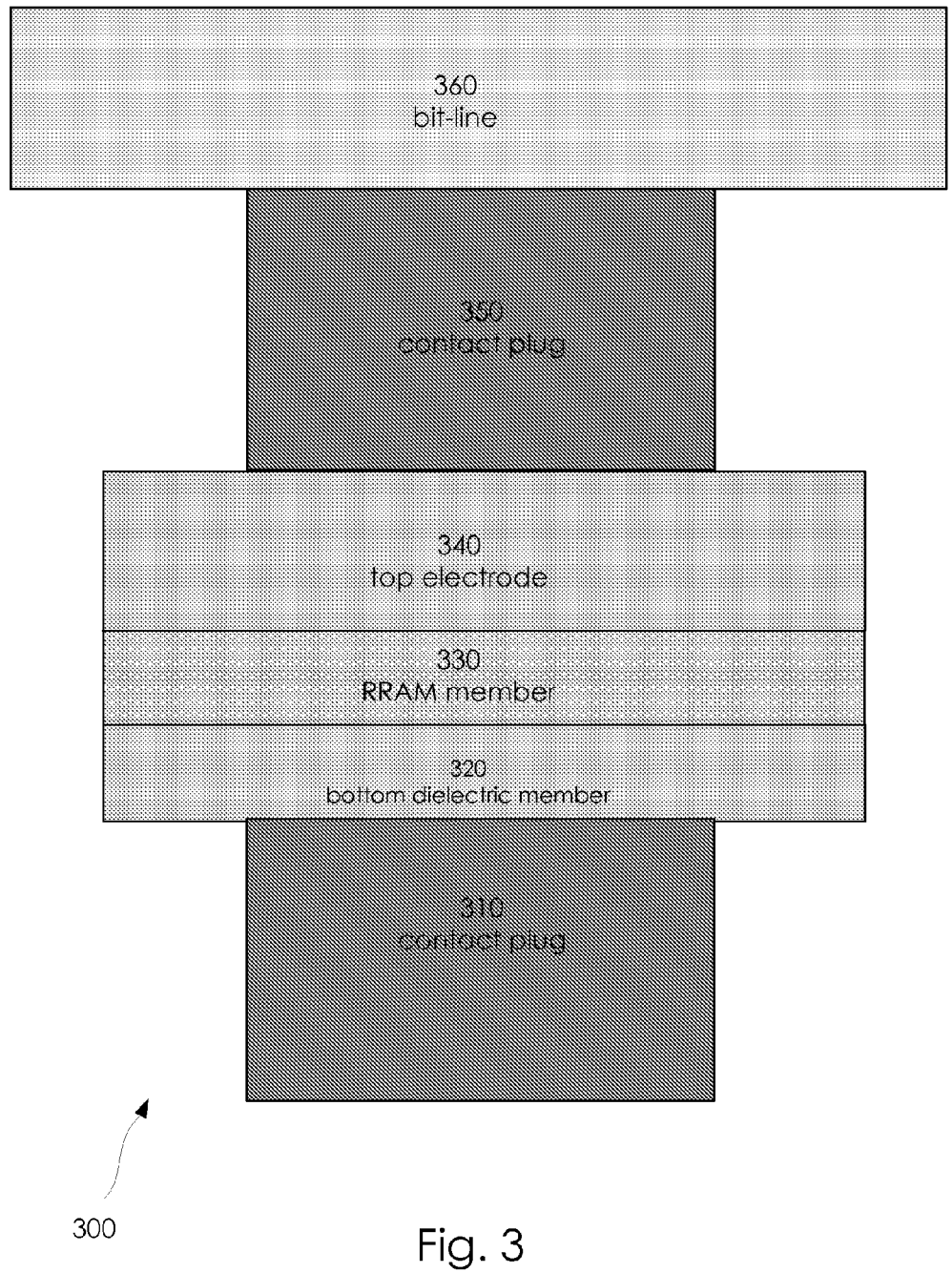
FIG. 3 is a simplified structural diagram illustrating a first embodiment of a resistance random access memory with a bottom dielectric member disposed between a resistance random access member and a contact plug (or a bottom electrode) in accordance with the present invention.

FIG. 3 is a simplified structural diagram illustrating a first embodiment of a resistance random access memory 300 with a bottom dielectric member 320 disposed between a resistance random access member 330 and a bottom electrode or contact plug 310. The resistance random access memory 300 comprises the contact plug 310, the bottom dielectric member 320 overlying the contact plug 310, the resistance random access memory member 330 overlying the bottom dielectric member 320, a top electrode 340 overlying the resistance random access member 330, a contact plug 350 overlying the top electrode 340, and a bit line 360 overlying the contact plug 350. The bottom dielectric member 320 is disposed between the contact plug 310 and the resistance random access member 330 for enhancing the duration of the data retention. Exemplary materials for constructing the bottom dielectric member 320 include silicon oxide, which is deposited using plasma enhanced (PE) or high-density-plasma (HDP) chemical vapor (CVD) deposition. The bottom dielectric member 320 typically ranges from about 1 nm to about 10 nm, or less than 1 nm. In this embodiment, the top electrode 340, the resistance random access memory member 330, and the bottom dielectric member 320 have about the same dimensional values, e.g. the same lengths such that the sides are aligned to each other, which are longer than the width of the contact plug 310.

The resistive memory layer 330 is formed from a material that includes at least two stable resistance levels, referred to as resistance random access memory material. Several materials have proved useful in fabricating RRAM, as described below.

The term "bistable RRAM" refers to the control of a resistance level by one of the follow means: a voltage amplitude, a current amplitude or the electrical polarity. The state controlling of a phase-change memory is conducted by the voltage amplitude, the current amplitude, or the pulse time. The electrical polarity of the bistable RRAM 300 does not affect the programming of the bistable RRAM 300.

The following are short summaries describing four types of resistive memory material suitable for implementing an RRAM. A first type of memory material suitable for use in embodiments is colossal magnetoresistance ("CMR") material, such as $Pr_xCa_yMnO_3$ where x:y=0.5:0.5, or other compositions with x: 0~1; y: 0~1. CMR material that includes Mn oxide is alternatively used.

An exemplary method for forming CMR material uses PVD sputtering or magnetron-sputtering method with source gases of Ar, $N_2$, $O_2$, and/or He, etc. at the pressure of 1 mTorr~100 mTorr. The deposition temperature can range from room temperature to ~600° C., depending on the post-deposition treatment condition. A collimater with an aspect ratio of 1~5 can be used to improve the fill-in performance. To improve the fill-in performance, the DC bias of several tens of volts to several hundreds of volts is also used. On the other hand, DC bias and the collimater can be used simultaneously.

A magnetic field of several tens of Gauss to as much as a Tesla (10,000 Gauss) may be applied to improve the magnetic crystallized phase.

A post-deposition annealing treatment in vacuum or in an $N_2$ ambient or $O_2/N_2$ mixed ambient is optionally used to improve the crystallized state of CMR material. The annealing temperature typically ranges from 400° C. to 600° C. with an annealing time of less than 2 hours.

The thickness of CMR material depends on the design of the cell structure. A CMR thickness of 10 nm to 200 nm can be used for the core material. A buffer layer of YBCO ($YBaCuO_3$, which is a type of high temperature superconductor material) is often used to improve the crystallized state of CMR material. The YBCO is deposited before the deposition of CMR material. The thickness of YBCO ranges from 30 nm to 200 nm.

A second type of memory material is two-element compounds, such as $Ni_xO_y$; $Ti_xO_y$; $Al_xO_y$; $W_xO_y$; $Zn_xO_y$; $Zr_xO_y$; $Cu_xO_y$; etc, where x:y=0.5:0.5, or other compositions with x: 0~1; y: 0~1. An exemplary formation method uses a PVD sputtering or magnetron-sputtering method with reactive gases of Ar, $N_2$, $O_2$, and/or He, etc. at a pressure of 1 mTorr~100 mTorr, using a target of metal oxide, such as $Ni_xO_y$; $Ti_xO_y$; $Al_xO_y$; $W_xO_y$; $Zn_xO_y$; $Zr_xO_y$; $Cu_xO_y$; etc. The deposition is usually performed at room temperature. A collimater with an aspect ratio of 1~5 can be used to improve the fill-in performance. To improve the fill-in performance, the DC bias of several tens of volts to several hundreds of volts is also used. If desired, DC bias and the collimater can be used simultaneously.

A post-deposition annealing treatment in vacuum or in an $N_2$ ambient or $O_2/N_2$ mixed ambient is optionally performed to improve the oxygen distribution of metal oxide. The annealing temperature ranges from 400° C. to 600° C. with an annealing time of less than 2 hours.

An alternative formation method uses a PVD sputtering or magnetron-sputtering method with reactive gases of $Ar/O_2$, $Ar/N_2/O_2$, pure $O_2$, $He/O_2$, $He/N_2/O_2$ etc. at a pressure of 1 mTorr~100 mTorr, using a target of metal oxide, such as Ni, Ti, Al, W, Zn, Zr, or Cu etc. The deposition is usually performed at room temperature. A collimater with an aspect ratio of 1~5 can be used to improve the fill-in performance. To improve the fill-in performance, a DC bias of several tens of volts to several hundreds of volts is also used. If desired, DC bias and the collimater can be used simultaneously.

A post-deposition annealing treatment in vacuum or in an $N_2$ ambient or $O_2/N_2$ mixed ambient is optionally performed to improve the oxygen distribution of metal oxide. The annealing temperature ranges from 400° C. to 600° C. with an annealing time of less than 2 hours.

Yet another formation method uses oxidation by a high temperature oxidation system, such as a furnace or a rapid thermal pulse ("RTP") system. The temperature ranges from 200° C. to 700° C. with pure $O_2$ or $N_2/O_2$ mixed gas at a pressure of several mTorr to 1 atm. The time can range several minutes to hours. Another oxidation method is plasma oxidation. An RF or a DC source plasma with pure $O_2$ or $Ar/O_2$ mixed gas or $Ar/N_2/O_2$ mixed gas at a pressure of 1 mTorr to 100 mTorr is used to oxidize the surface of metal, such as Ni, Ti, Al, W, Zn, Zr, or Cu etc. The oxidation time ranges several seconds to several minutes. The oxidation temperature ranges from room temperature to 300° C., depending on the degree of plasma oxidation.

A third type of memory material is a polymer material, such as TCNQ with doping of Cu, $C_{60}$, Ag etc. or a PCBM-TCNQ mixed polymer. One formation method uses evaporation by thermal evaporation, e-beam evaporation, or molecular beam epitaxy ("MBE") system. A solid-state TCNQ and dopant pellets are co-evaporated in a single chamber. The solid-state TCNQ and dopant pellets are put in a W-boat, a Ta-boat or a ceramic boat. A high electrical current or an electron-beam is applied to melt the source so that the materials are mixed and deposited on wafers. There are no reactive chemistries or gases. The deposition is performed at a pressure of $10^{-4}$ Torr to $10^{-10}$ Torr. The wafer temperature ranges from room temperature to 200° C.

A post-deposition annealing treatment in vacuum or in an $N_2$ ambient is optionally performed to improve the composition distribution of polymer material. The annealing temperature ranges from room temperature to 300° C. with an annealing time of less than 1 hour.

Another technique for forming a layer of polymer-based memory material is using a spin-coater with doped-TCNQ solution at a rotation of less than 1000 rpm. After spin-coating, the wafer is held (typically at room temperature or temperature less than 200° C.) for a time sufficient for solid-state formation. The hold time ranges from several minutes to days, depending on the temperature and on the formation conditions.

A fourth type of memory material is chalcogenide material, such as $Ge_xSb_yTe_z$ where x:y:z=2:2:5, or other compositions with x: 0~5; y: 0~5; z: 0~10. GeSbTe with doping, such as N—, Si—, Ti—, or other element doping is alternatively used.

An exemplary method for forming chalcogenide material uses a PVD-sputtering or magnetron-sputtering method with source gas(es) of Ar, $N_2$, and/or He, etc. at a pressure of 1 mTorr~100 mTorr. The deposition is usually performed at room temperature. A collimater with an aspect ratio of 1~5 can be used to improve the fill-in performance. To improve the fill-in performance, a DC bias of several tens of volts to several hundreds of volts is also used. On the other hand, DC bias and the collimater can be used simultaneously.

A post-deposition annealing treatment in vacuum or in an $N_2$ ambient is optionally performed to improve the crystallized state of chalcogenide material. The annealing temperature typically ranges from 100° C. to 400° C. with an annealing time of less than 30 minutes. The thickness of chalcogenide material depends on the design of the cell structure. In general, a chalcogenide material with thickness greater than 8 nm can have a phase change characterization so that the material exhibits at least two stable resistance states.

Embodiments of the memory cell in the bistable RRAM 300 may include phase change based memory materials, including chalcogenide based materials and other materials, for the resistance random access memory member 330. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", *SPIE* v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 patent at columns 11-13, which examples are hereby incorporated by reference.

Phase change alloys can be switched between a first structural state, in which the material is in a generally amorphous solid phase, and a second structural state, in which the material is in a generally crystalline solid phase, in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistive memory materials may be used in other embodiments of the invention, including $N_2$ doped GST, $Ge_xSb_y$, or other material that uses different crystal phase changes to determine resistance; $Pr_xCa_yMnO_3$, $PrSrMnO_3$, $ZrO_x$, $WO_x$, $TiO_x$, $AlO_x$, or other material that uses an electrical pulse to change the resistance state; 7,7,8, 8-tetracyanoquinodimethane (TCNQ), methanofullerene 6,6-phenyl C61-butyric acid methyl ester (PCBM), TCNQ-PCBM, Cu-TCNQ, Ag-TCNQ, $C_{60}$-TCNQ, TCNQ doped with other metal, or any other polymer material that has bistable or multi-stable resistance state controlled by an electrical pulse.

Processes for manufacturing the bit-line 360, the top electrode 340, and the contact plugs 310, 350 can be selected from commercially available methods. Although silicon oxide has been identified above as a suitable material for implementing the bottom dielectric member 320, other suitable materials for implementing the bottom dielectric member 320 can be practiced without departing from the spirit of the present invention.

Figure 4:
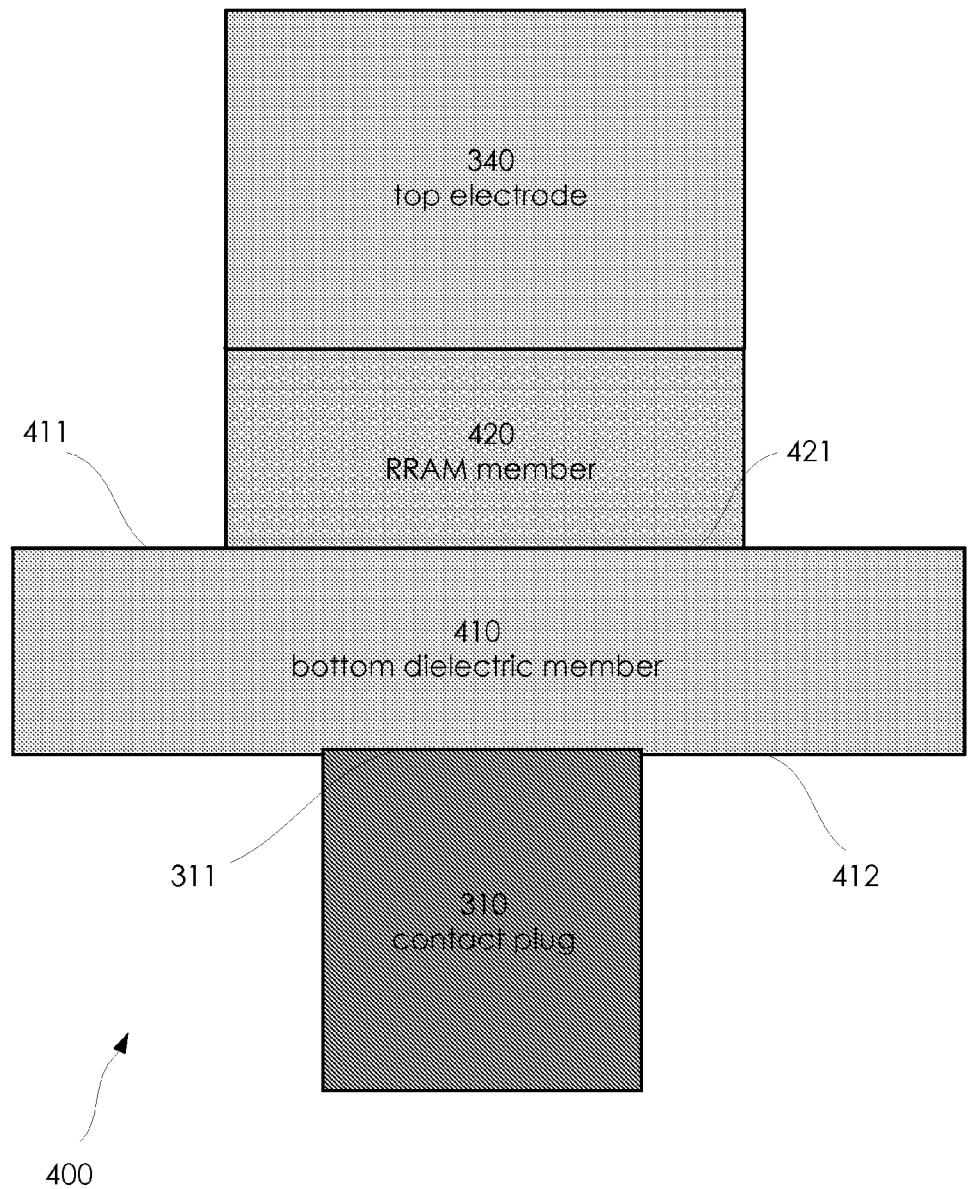
FIG. 4 is a simplified structural diagram illustrating a second embodiment of a resistance random access memory with a bottom dielectric member disposed between a resistance random access member and the contact plug where the bottom dielectric member and the resistance random access member have varying lengths in accordance with the present invention.

FIG. 4 is a simplified structural diagram illustrating a second embodiment of a resistance random access memory 400 with a bottom dielectric member 410 disposed between a resistance random access member 420 and the contact plug 310 where the bottom dielectric member 410 and the resistance random access member 420 have varying lengths. The length of the bottom dielectric member 410 is longer than the resistance random access memory member 420 immediately above, and is longer than the contact plug 310 immediately below. The bottom dielectric member 410 has an upper surface 411 and a lower surface 412. The upper surface 411 of the bottom dielectric member 410 extends beyond a bottom surface 421 of the RRAM member 420. The lower surface 412 of the bottom dielectric member 410 extends beyond a top surface 311 of the contact plug 310. The resistance random access memory member 420 has about the same length as the length of the top electrode 340.

Figure 5:
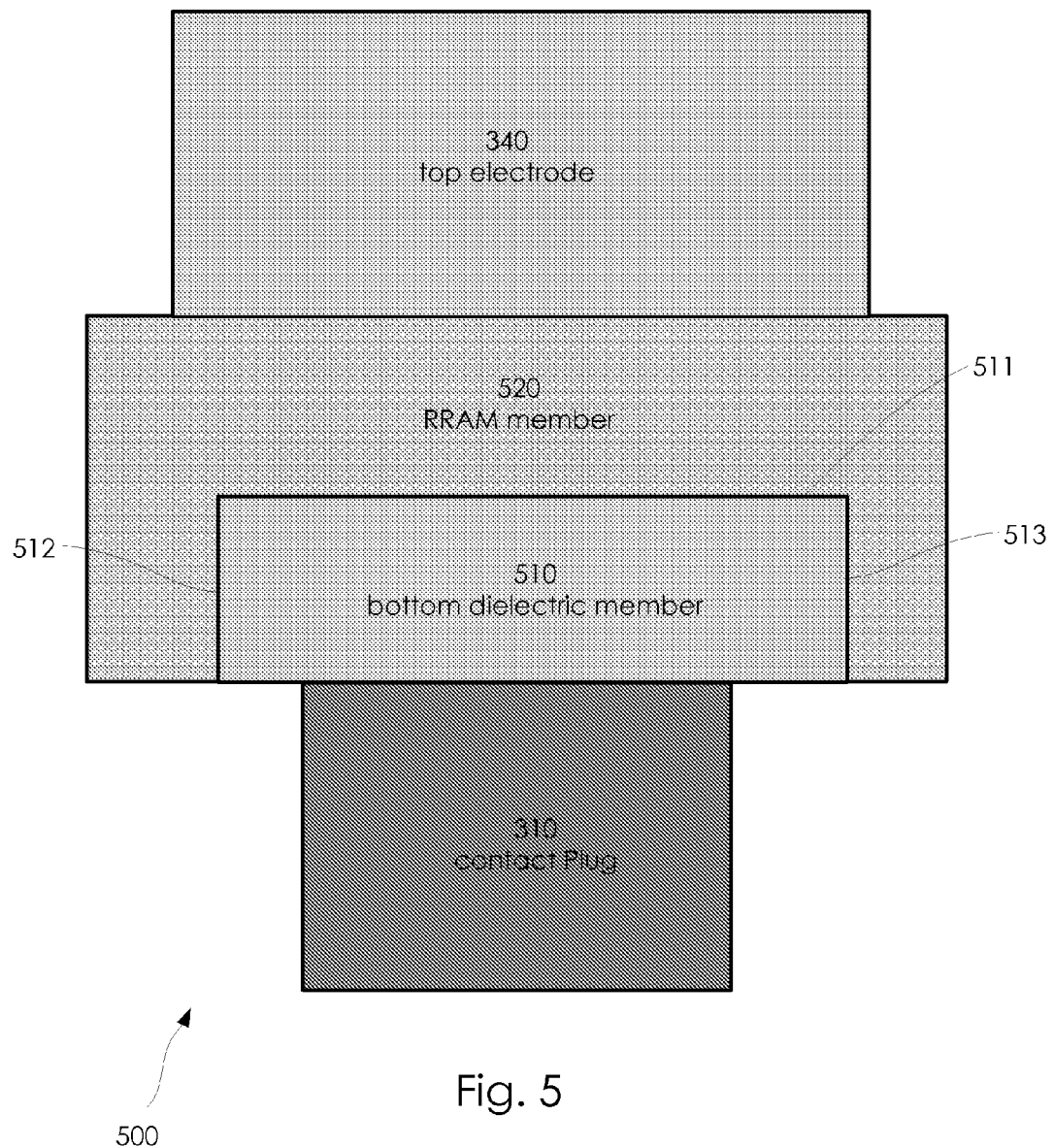
FIG. 5 is a simplified structural diagram illustrating a third embodiment of a resistance random access memory with a bottom dielectric member disposed between a resistance random access member and the contact plug where the resistance random access member embodies the bottom dielectric member in accordance with the present invention.

FIG. 5 is a simplified structural diagram illustrating a third embodiment of a resistance random access memory 500 with a bottom dielectric member 510 disposed between a resistance random access member 520 and the contact plug 310 where the resistance random access member 520 embodies the bottom dielectric member 510. The bottom dielectric member 510 is disposed within the resistance random access member 520. The bottom dielectric member 510 includes an upper surface 511 and side walls 512, 513. The resistance random access memory member 520 substantially covers the upper surface 511 of the bottom dielectric member 510, and the sidewalls 512, 513 of the bottom dielectric member 510.

Figure 6:
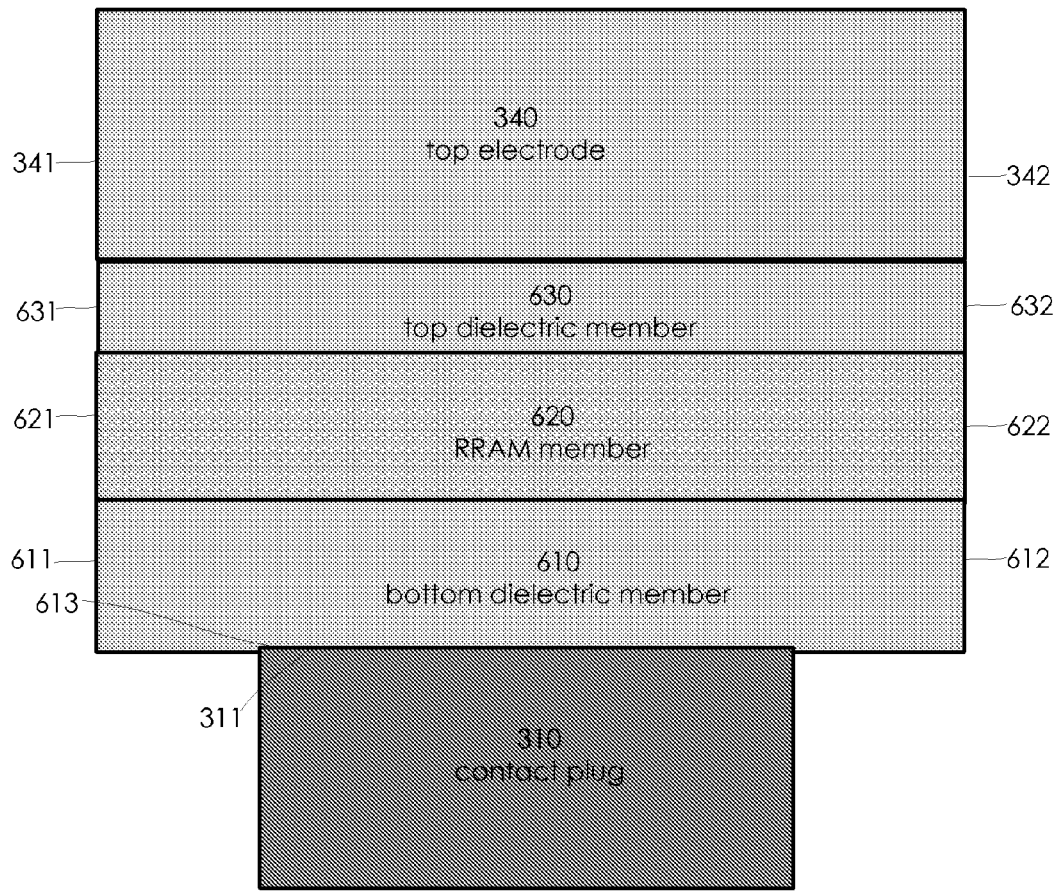
FIG. 6 is a simplified structural diagram illustrating a fourth embodiment of a resistance random access memory with a bottom dielectric member disposed between a resistance random access member and the contact plug where the resistance random access member is placed between a top dielectric member and the bottom dielectric member in accordance with the present invention.

FIG. 6 is a simplified structural diagram illustrating a fourth embodiment of a resistance random access memory 600 with a bottom dielectric member 610 disposed between a resistance random access member 620 and the contact plug 310 where the resistance random access member 620 is placed between a top dielectric member 630 and the bottom dielectric member 610. The bottom dielectric member 610 includes sides 611, 612 and lower surface 613. The lower surface 613 of the bottom dielectric member 610 has a length that is longer than an upper surface 311 of the contact plug 310. The top electrode 340, the top dielectric member 630, the resistance random access member 620, and the bottom dielectric member 610 have sides that are substantially aligned with each other. The top electrode 340 has sides 341, 342, the top dielectric member 630 has sides 631, 632, the resistance random access member 620 has sides 621, 622, and the bottom dielectric member 610 has sides 611, 612. The sides 341, 342 of the top electrode 340, the sides 631, 632 of the top dielectric member 630, the sides 621, 622 of the resistance random access member 620, and the sides 611, 612 of the bottom dielectric member 610 are substantially aligned with one another.

Figure 7:
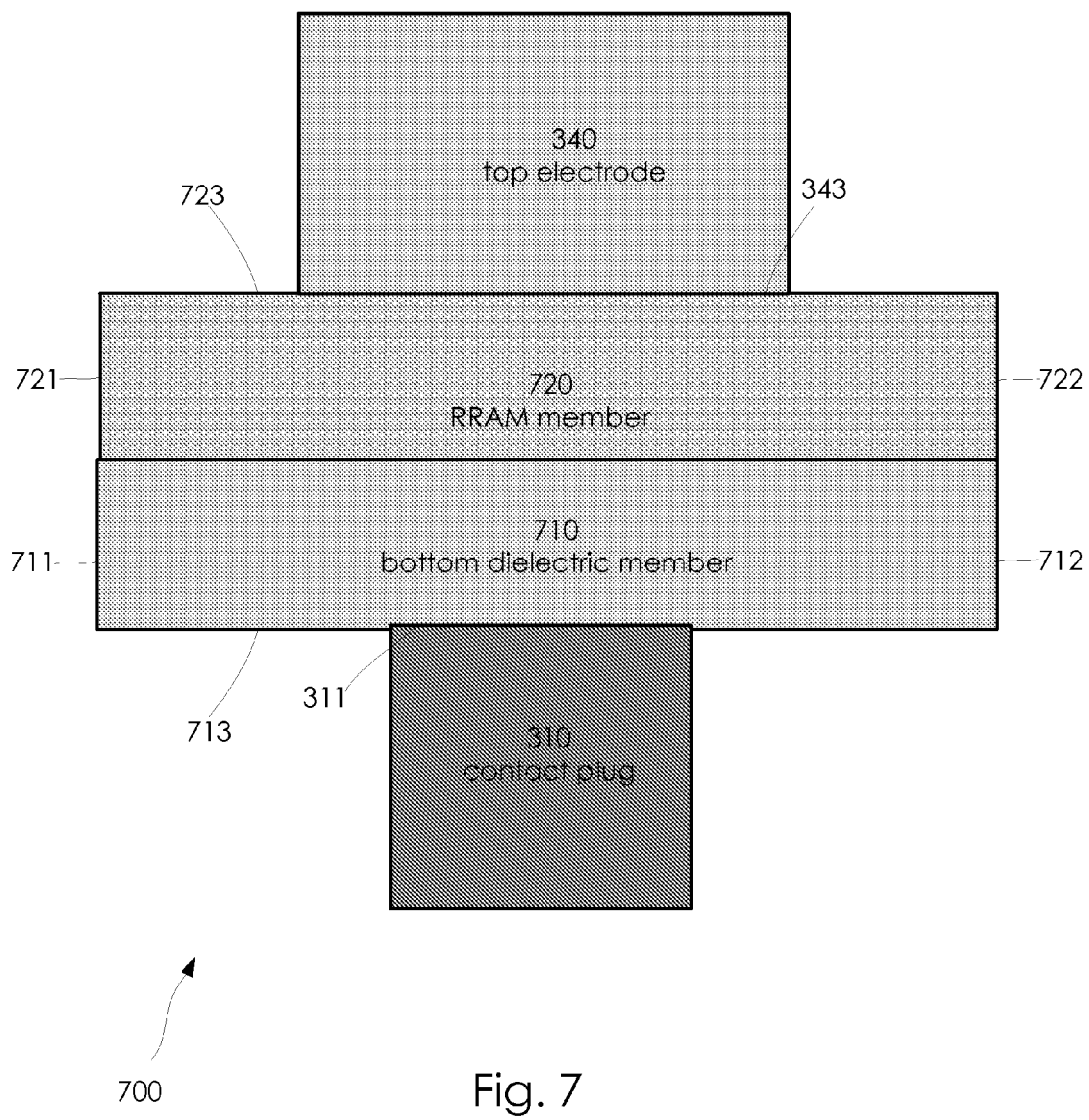
FIG. 7 is a simplified structural diagram illustrating a fifth embodiment of a resistance random access memory with a bottom dielectric member disposed between a resistance random access member and the contact plug where the bottom dielectric member and the resistance random access member have elongated lengths in accordance with the present invention.

FIG. 7 is a simplified structural diagram illustrating a fifth embodiment of a resistance random access memory 700 with a bottom dielectric member 710 disposed between a resistance random access member 720 and the contact plug 310 where the lengths of the bottom dielectric member 710 and the resistance random access member 720 are elongated. The bottom dielectric member 710 has a lower surface 713 which has a length that is longer than an upper surface 311 of the contact plug 310. The resistance random access memory member 720 has an upper surface 723 which has a length that is longer than a lower surface 343 of the top electrode 340. The resistance random access memory member 720 has sides 721, 722, and the bottom dielectric member 710 has sides 711, 712. The sides 711, 712 of the bottom dielectric member 710 are substantially aligned with the sides 721, 722 of the resistance random access memory member 720.

Figure 8:
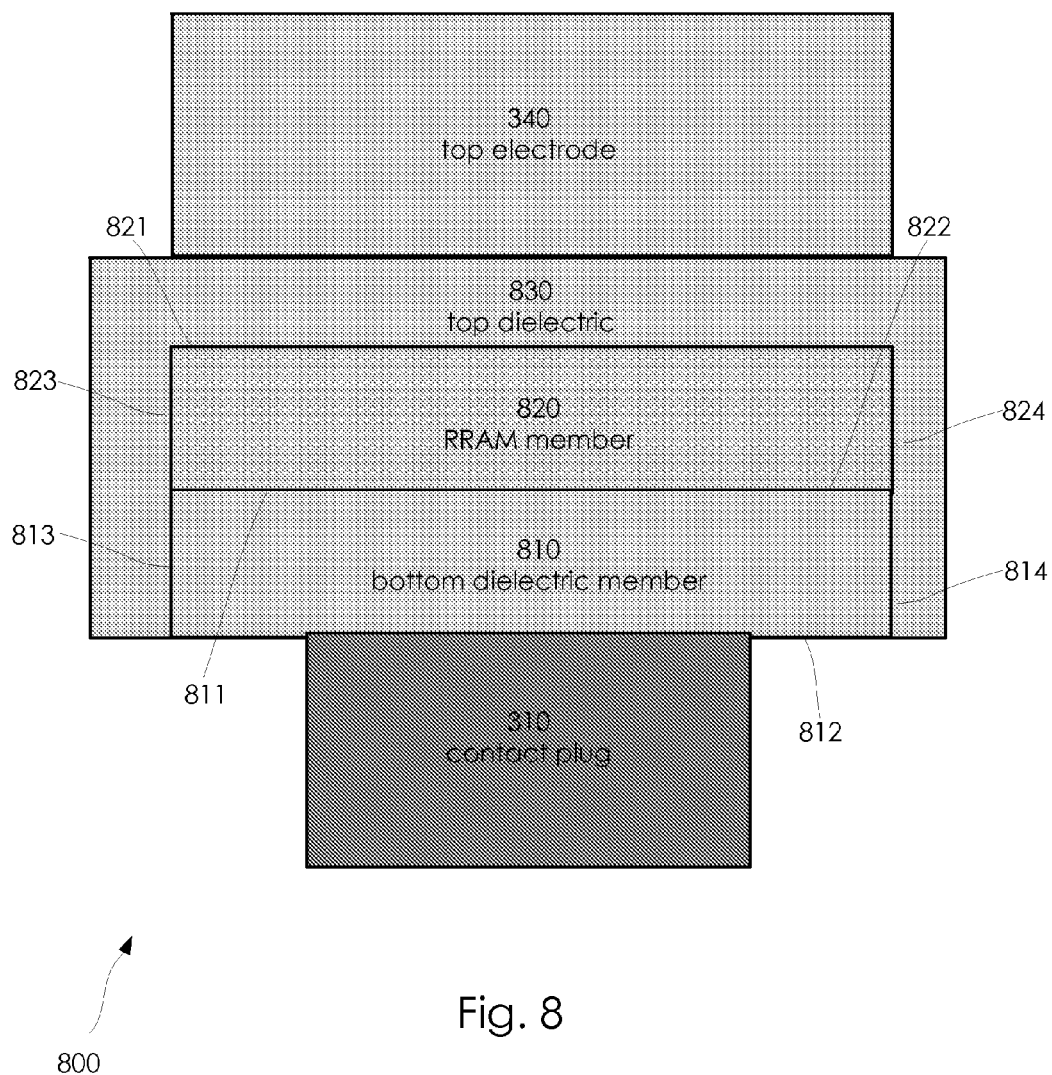
FIG. 8 is a simplified structural diagram illustrating a sixth embodiment of a resistance random access memory with a bottom dielectric member disposed between a resistance random access member and the contact plug where a top dielectric member embodies the resistance random access member and a bottom dielectric member, in accordance with the present invention.

FIG. 8 is a simplified structural diagram illustrating a sixth embodiment of a resistance random access memory 800 with a bottom dielectric member 810 disposed between a resistance random access member 820 and the contact plug 310 where a top dielectric member 830 embodies the resistance random access member 820 and a bottom dielectric member 810. The resistance random access member 820 and the bottom dielectric member 810 are disposed within the top dielectric 830. The bottom dielectric member 810 includes an upper surface 811, a lower surface 812, and side walls 813, 814. The resistance random access memory member 820 includes an upper surface 821, a lower surface 822, and side walls 823, 824. The top electrode 830 comprises an inverted u-like shape that substantially covers the upper surface 821 of the resistance random access memory member 820, the side walls 823, 813 of the resistance random access memory member 820 and the bottom dielectric member 810, and substantially covers the side walls 824, 814 of the resistance random access memory member 820 and the bottom dielectric member 810.

Figure 9:
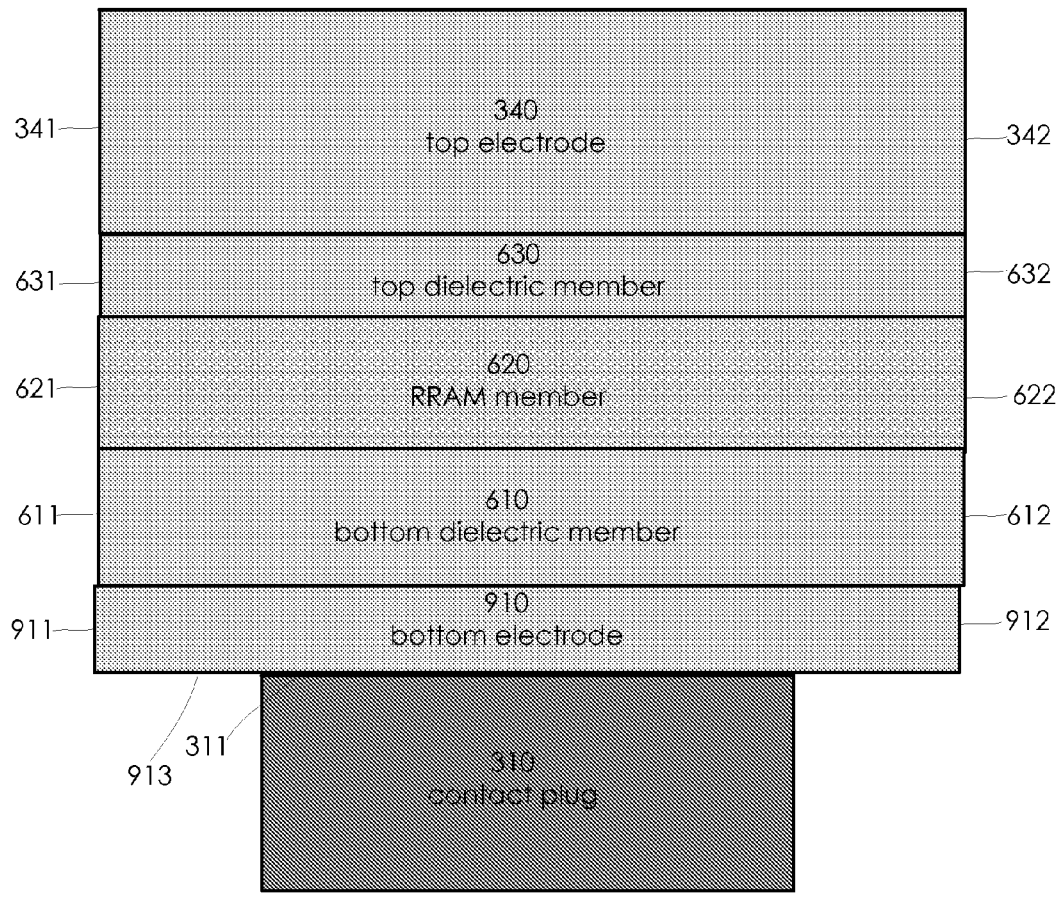
FIG. 9 is a simplified structural diagram illustrating a sixth embodiment of a resistance random access memory with a bottom dielectric member underlying a resistance random access memory member where the resistance random access member is placed between the top dielectric member and the bottom dielectric member, the top dielectric member underlying the top electrode, the bottom dielectric member overlying a bottom electrode, and the bottom electrode overlying the contact plug in accordance with the present invention.

FIG. 9 is a simplified structural diagram illustrating a sixth embodiment of a resistance random access memory 900 with a bottom dielectric member 820 underlying a resistance random access memory member 830 where the resistance random access member 620 is placed between the top dielectric member 630 and the bottom dielectric member 610, the top dielectric member 630 underlying the top electrode 340, the bottom dielectric member 610 overlying a bottom electrode 910, and the bottom electrode 910 overlying the contact plug 310. The bottom electrode 910 includes sides 911, 912 and lower surface 913. The sides 341, 342 of the top electrode 340, the sides 631, 632 of the top dielectric member 630, the sides 621, 622 of the resistance random access memory member 620, the sides 611, 612 of the bottom dielectric member 610, and the sides 911, 912 of the bottom electrode 910 are substantially aligned with one another. The lower surface 913 of the bottom electrode 910 has a length that is longer than the upper surface 311 of the contact plug 310.

Figure 10A:
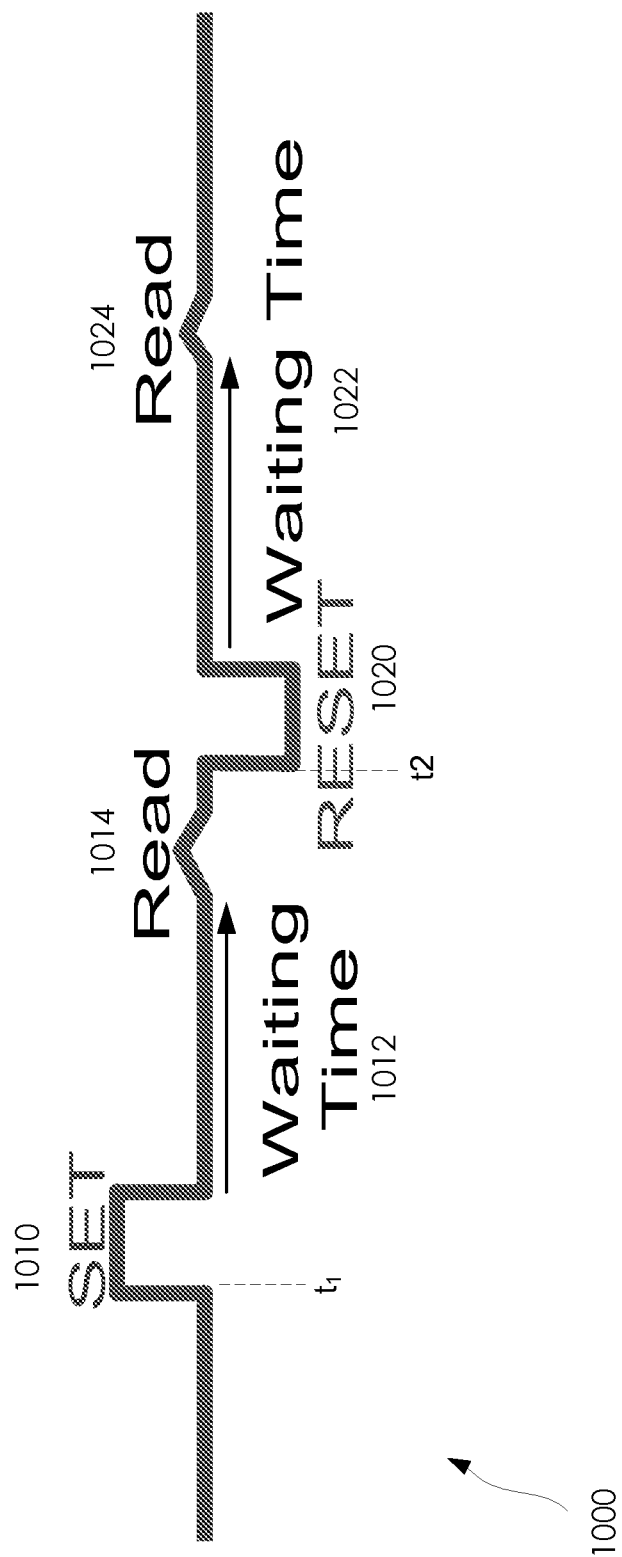
FIG. 10A is a timing diagram illustrating the measuring of a SET/RESET window of a programmable resistance random access memory in accordance with the present invention.

FIG. 10A is a timing diagram 1000 illustrating the measuring of a SET/RESET window of a programmable resistance random access memory. A SET operation 1010 begins at time $t_1$. After a waiting time 1012, a read operation 1014 is executed to read the READ current. At time $t_2$, the RESET operation 1020 begins. After a waiting time 1022, a read operation 1024 is executed to read the RESET current.

Figure 10B:
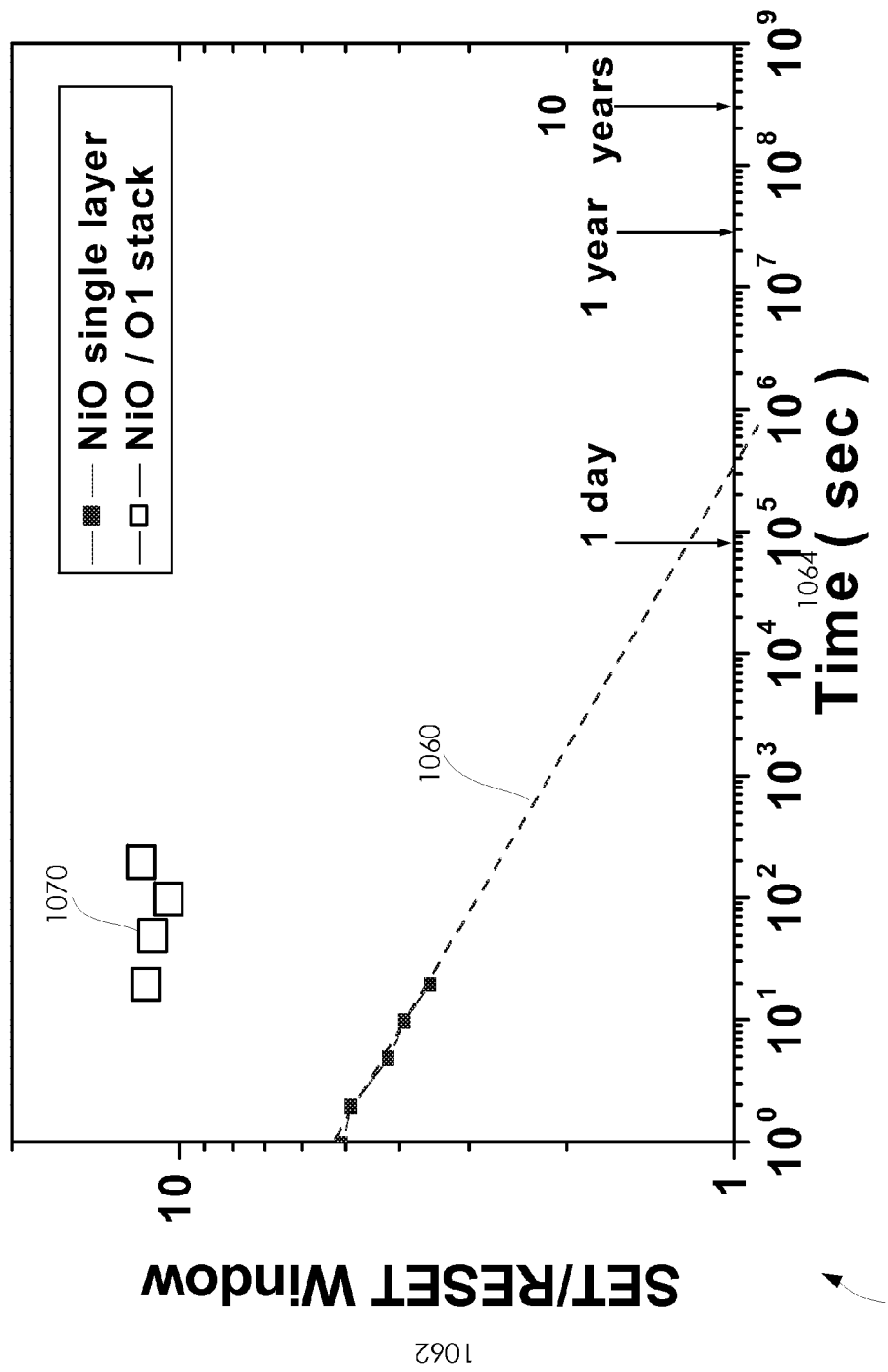
FIG. 10B is a graphical diagram illustrating sample data curves of a programmable resistance random access memory with and without a bottom dielectric member in which the graph has a SET/RESET window parameter on the y-axis and a retention test duration on the x-axis in accordance with the present invention.

FIG. 10B is a graphical diagram 1050 illustrating sample data curves of a programmable resistance random access memory with and without a bottom dielectric member in which the graph 1050 shows a SET/RESET window parameter 1062 on the y-axis and a retention test duration 1064 on the x-axis. A curve 1060 represents a programmable resistance random access memory with a resistance random access memory member implemented with nickel oxide (NiO) without a bottom dielectric member underlying the resistance random access memory member. The SET/RESET window 1062 operates in a logarithmic fashion over time. The SET/RESET window 1062 for the curve 1060 approaches closer to "1" after 1 day of retention time.

A curve 1070 represents a programmable resistance random access memory with a resistance random access memory member implemented with nickel oxide (NiO) with a bottom dielectric member underlying the resistance random access memory member. The bottom dielectric member in this illustration is deposited using chemical vapor deposition and has a thickness of about 10 nm. The SET/RESET window 1062 for the curve 1070 remains at high levels and does not degrade substantially over time, thereby improving the data retention in the resistance random access memory member 330.

For additional information on the manufacture, component materials, use and operation of phase change random access memory devices, see U.S. patent application Ser. No. 11/155,067 entitled "Thin Film Fuse Phase Change RAM and Manufacturing Method", filed on 17 Jun. 2005, owned by the assignee of this application and incorporated by reference as if fully set forth herein.

The invention has been described with reference to specific exemplary embodiments. Various modifications, adaptations, and changes may be made without departing from the spirit and scope of the invention. Accordingly, the specification and drawings are to be regarded as illustrative of the principles of this invention rather than restrictive, the invention is defined by the following appended claims.

We claim:

1. A memory structure, comprising:
   a first electrode and a conductive member;
   a resistance memory member in contact with the first electrode;
   a bottom dielectric member located between the resistance memory member and the conductive member so that current flow between the resistance memory member and the conductive member is through the bottom dielectric member; and
   the bottom dielectric member having a dimension d1, the resistance memory member having a dimension d2, dimension d1 being larger than dimension d2, dimensions d1 and d2 being measured parallel to a line extending between the resistance memory member and the bottom dielectric member.

2. The memory structure of claim 1, wherein the bottom dielectric member is a substantially planar structure.

3. The memory structure of claim 1, wherein the resistance memory member is a substantially planar structure.

4. The memory structure of claim 1, wherein the resistance memory member directly contacts the first electrode.

5. The memory structure of claim 1, wherein the resistance memory member directly contacts the bottom dielectric member.

6. The memory structure of claim 1, wherein the resistance memory member directly contacts both the first electrode and the bottom dielectric member, and the bottom dielectric member directly contacts the conductive member.

7. The memory structure of claim 1, further comprising a top dielectric member between the resistance memory member and the first electrode.

8. The memory structure of claim 1, wherein the conductive member comprises a contact plug.

9. The memory structure of claim 1, wherein the bottom dielectric member has a thickness of about 10 nm or less.

10. The memory structure of claim 1, wherein the resistance memory member comprises one of the following two-element compounds: $Ni_xO_y$, $Ti_xO_y$, $Al_xO_y$, $W_xO_y$, $Zn_xO_y$, $Zr_xO_y$, $Cu_xO_y$, where x:y=0.5:0.5.

11. A memory structure, comprising:
   a first electrode and a conductive member;
   a resistance memory member disposed between the first electrode and the conductive member;
   a bottom dielectric member located between the resistance memory member and the conductive member;
   the bottom dielectric member having a dimension d1, the resistance memory member having a dimension d2, dimension d1 being larger than dimension d2, dimensions d1 and d2 being measured parallel to a line extending between the resistance memory member and the bottom dielectric member; and
   the resistance memory member comprising a two-element compound with a composition of $Me_xO_y$, wherein Me is a metal and x: 0~1; y: 0~1.

12. The memory structure of claim 1, wherein the resistance memory member comprises a metal-doped metal-oxide including Al:ZnO and Al:ZrO.

13. A memory structure, comprising:
   a first electrode and a conductive member;
   a resistance memory member in contact with the first electrode;
   a bottom dielectric member located between the resistance memory member and the conductive member so that current flow between the resistance memory member and the conductive member is through the bottom dielectric member; and
   the bottom dielectric member having a top surface, wherein an area of the top surface is not in contact with the resistance memory member.

14. The memory structure of claim 13, wherein the top surface of the bottom dielectric member has first and second of said areas not in contact with the resistance memory member.

15. The memory structure of claim 13, wherein:
   the bottom dielectric member has a bottom surface; and
   an area of the bottom surface is not in contact with the conductive member.

16. The memory structure of claim 13, wherein the bottom dielectric member and the resistance memory member are substantially planar structures.

17. The memory structure of claim 13, wherein the resistance memory member directly contacts the first electrode and the bottom dielectric member.

18. The memory structure of claim 13, wherein the bottom dielectric member has a thickness of about 10 nm or less.

19. The memory structure of claim 13, wherein the resistance memory member comprises one of the following two-element compounds: $Ni_xO_y$, $Ti_xO_y$, $Al_xO_y$, $W_xO_y$, $Zn_xO_y$, $Zr_xO_y$, $Cu_xO_y$, where x:y=0.5:0.5.

20. A memory structure, comprising:
   a first electrode and a conductive member;
   a resistance memory member disposed between the first electrode and the conductive member;
   a bottom dielectric member located between the resistance memory member and the conductive member;
   the bottom dielectric member having a dimension d1, the resistance memory member having a dimension d2, dimension d1 being larger than dimension d2, dimensions d1 and d2 being measured parallel to a line extending between the resistance memory member and the bottom dielectric member; and
   the resistance memory member comprising a two-element compound with a composition of $Me_xO_y$, wherein Me is a metal and x: 0~1; y: 0~1.

* * * * *